United States Patent [19]

Torigoe

[11] Patent Number: 4,822,975
[45] Date of Patent: Apr. 18, 1989

[54] METHOD AND APPARATUS FOR SCANNING EXPOSURE

[75] Inventor: Makoto Torigoe, Kawasaki, Japan

[73] Assignee: Canon Kabushiki Kaisha, Tokyo, Japan

[21] Appl. No.: 217,058

[22] Filed: Jul. 8, 1988

Related U.S. Application Data

[63] Continuation of Ser. No. 45,183, Apr. 30, 1987, abandoned, which is a continuation of Ser. No. 769,772, Aug. 27, 1985, abandoned, which is a continuation-in-part of Ser. No. 694,843, Jan. 29, 1985, abandoned.

[30] Foreign Application Priority Data

Jan. 30, 1984 [JP] Japan .................................. 59-13316
Jun. 5, 1985 [JP] Japan .................................. 60-122184

[51] Int. Cl.$^4$ ........................................... B23K 26/00
[52] U.S. Cl. ........................... 219/121.85; 219/121.80; 219/121.74
[58] Field of Search ...................... 219/121.68, 121.69, 219/121.80, 121.73, 121.74, 121.6, 121.85, 121.65, 121.66; 355/53, 54, 74; 346/160, 296; 350/505, 620, 619

[56] References Cited

U.S. PATENT DOCUMENTS

| | | | |
|---|---|---|---|
| 3,632,205 | 1/1972 | Marcy | 219/121 LH X |
| 3,739,088 | 6/1973 | Landsman | 219/121 LJ X |
| 3,797,935 | 3/1974 | Marcy | 355/53 |
| 4,081,654 | 3/1978 | Mracek | 219/121 LW X |
| 4,156,124 | 5/1979 | Macken et al. | 219/121 LH |
| 4,215,934 | 8/1980 | Karasawa et al. | 350/505 X |
| 4,376,580 | 3/1983 | Novak et al. | 350/620 X |
| 4,425,037 | 1/1984 | Hershel | 355/53 |
| 4,448,513 | 5/1984 | Hirayama et al. | 346/160 X |
| 4,450,358 | 5/1984 | Reynolds | 219/121 LA X |
| 4,456,994 | 7/1984 | Jain et al. | 354/4 |
| 4,518,232 | 5/1985 | Dagenais | 219/121 LQ X |
| 4,639,073 | 1/1987 | Yip et al. | 358/296 X |

FOREIGN PATENT DOCUMENTS 2519156 7/1983 France .

Primary Examiner—C. L. Albritton
Attorney, Agent, or Firm—Fitzpatrick, Cella, Harper & Scinto

[57] ABSTRACT

A method and an apparatus for scanning exposure, with a pulsed laser beam. A pattern of a first member is irradiated by the pulsed laser beam and the pattern of the first member is projected onto a second member. During the pattern projection the first and second members are moved in a predeterminedly synchronized relation, while the irradiation or pulse emission and the movement of the first and second members are co-ordinate with each other, whereby a uniform or substantially uniform amount of exposure is ensured on the second member. In one preferred form, a relationship $V=LN$ is satisfied, wherein V is the speed of scanning movement of the first and second objects or the moving speed of the first object, L is the spacing between two positions in the scan direction corresponding to the intensity level portions which are approximately equal to a half of the maximum level of the intensity distribution of each pulse, and N is the number of repetition of pulse emission per one second.

12 Claims, 5 Drawing Sheets

INTENSITY DISTRIBUTION
OF ONE PULSE

METHOD AND APPARATUS FOR SCANNING EXPOSURE

This application is a continuation of application Ser. No. 045,183, filed Apr. 30, 1987, now abandoned; which was a continuation of application Ser. No. 769,772, filed Aug. 27, 1985, now abandoned; which was a continuation-in-part of application Ser. No. 694,843, filed Jan. 25, 1985, now abandoned.

BACKGROUND OF THE INVENTION

This invention relates to a method and an apparatus for scanning exposure, and, more particularly, it relates to a scanning exposure method and a scanning exposure apparatus for use in the manufacture of semiconductor circuit devices.

Recent development in the semiconductor technology has enforced higher capacities and further miniaturization of the semiconductor circuit devices. Along such trend, photolithography techniques such as an optical exposure process have become more and more dominant with the development of high resolution lenses. In such exposure systems, a short wavelength of light within the deep UV range has recently been used to transfer and print a circuit pattern of a mask or reticle onto a wafer. This is because the resolution for the minimum line width of the circuit pattern to be printed on the wafer is proportional to the wavelength of the light.

Conventionally, heavy hydrogen lamps or Xe-Hg lamps have been used as the deep UV light sources. These lamps are featurized in the point of continuous emission in both cases of DC energization and AC energization.

Use of such light sources however involves inconveniences, because only a decreased output is obtainable in the deep UV range and the sensitivity of the photoresist material applied to the wafer surface is low. This results in a longer exposure time and a decreased throughput.

SUMMARY OF THE INVENTION

It is accordingly a primary object of the present invention to provide a method and an apparatus for performing exposure, with a higher throughput, particularly by using a wavelength of light in the deep UV range.

It is another object of the present invention to provide a method and an apparatus for performing scanning exposure, with a higher throughput, particularly by using a wavelength of light in the deep UV range.

It is a third object of the present invention to provide a method and an apparatus for performing scanning exposure, assuring uniformity in the amount of exposure as well as a higher throughput.

Briefly, according to the present invention, there are provided a method and an apparatus for scanning exposure, with a pulsed laser beam. A pattern of a first member is irradiated by the pulsed laser beam and the pattern of the first member is projected onto a second member. During the pattern projection the first and second members are moved in a predeterminedly synchronized relation, while the irradiation or pulse emission and the movement of the first and second members are co-ordinated with each other, whereby a uniform or substantially uniform amount of exposure is ensured on the second member. In one preferred form, a relationship $V=LN$ is satisfied, wherein V is the speed of scanning movement of the first and second objects or the moving speed of the first object, L is the spacing between two positions in the scan direction corresponding to the intensity level portions which are approximately equal to a half of the maximum level of the intensity distribution of each pulse, and N is the number of repetitions of pulse emission per one second.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

It has recently been found that an Excimer laser capable of providing a higher output in the deep UV range may be effective as the light source means for the exposure apparatus. However, the excimer laser is a pulse-oscillation type laser, as compared with the conventional continuous emission type heavy hydrogen lamps or Xe-Hg lamps. For this reason, scanning type exposure apparatuses, such as, e.g., slit-scan type exposure apparatuses, which have conventionally employed continuous emission type light sources as mentioned above, would not easily substitute the pulse-oscillation type lasers such as the excimer laser for the conventional continuous emission type light sources.

Figure 1A:
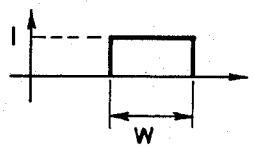
FIGS. 1A–1C illustrate a problem involved in a scanning type exposure apparatus in which a pulse-oscillation type light source is employed.
Figure 1B:
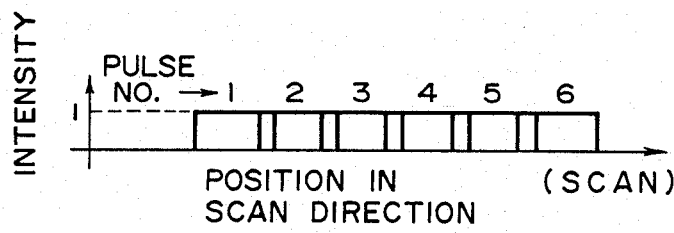
Figure 1C:
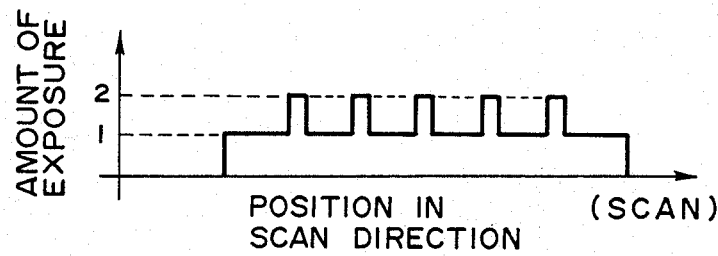

More specifically, it is now assumed that the light source provides a pulsed laser beam comprising beam pulses each having an intensity distribution of rectangular or oblong shape having a width w in the scan direction, as shown in FIG. 1A. If in such case the scanning speed, i.e. the time $t_1$ required for scanning the width w is greater than the pulse spacing, i.e. the time interval t2 between pulse emissions, the pulse exposures are partially overlapped in the direction of scan, such as shown in FIG. 1B. The overlap of pulse exposures results in uneven exposure as shown in, FIG. 1C.

Such difficulty as found by the Applicant is deleted by the present invention in which the scan and the pulse emission is co-ordinated with each other in a manner that uniform or substantially uniform exposure is assured. This will now be described in detail with reference to embodiments of the present invention.

Figure 2A:
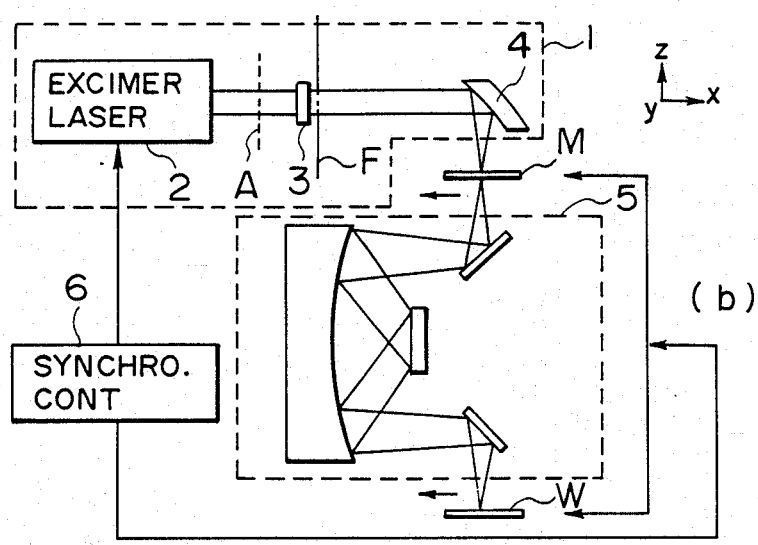
FIG. 2A is a schematic and diagrammatic cross-section showing an exposure apparatus according to an embodiment of the present invention.
Figure 2B:
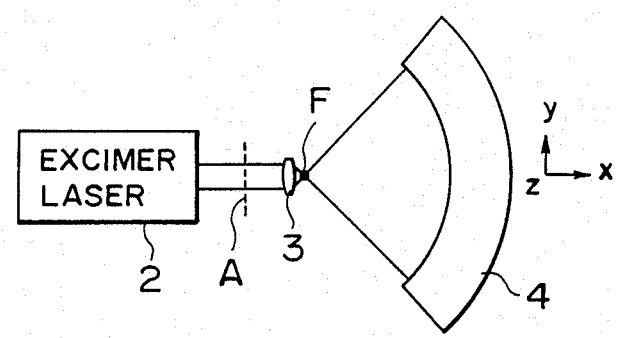
FIG. 2B is a schematic and diagrammatic plan-view showing an illumination unit of the exposure apparatus of FIG. 2A.

FIG. 2A is a cross-sectional view schematically and diagrammatically showing a scanning exposure apparatus of reflection projection type, according to an embodiment of the present invention. The exposure apparatus includes an illumination unit 1 which also is shown in the plan view of FIG. 2B. The illumination unit 1 has a light source 2, such as an excimer laser, providing a pulsed laser beam. Within the light source 2, a gas of, e.g., KrF or XeCl is sealingly contained, so that a wavelength of light in the deep UV range such as 248 nm (in the case of KrF gas) or 308 nm (in the case of XeCl gas) is emitted in the form of pulses.

The illumination unit 1 further includes a convex cylindrical or toric lens 3 made of a material transmissive to the wavelength in the deep UV range, and a segmentary or arcuate spherical mirror 4. The lens 3 and the mirror 4 are disposed along the optical path provided by the light source 2. Along the optical path defined by the spherical mirror 4, a reticle or a mask M, a reflection type projection optical system 5 and a wafer W are disposed in the named order. The mask M and the wafer W are carried as a unit by an unshown carriage and are movable in the direction of the x-axis in FIG. 2A. The moving speed of the mask and wafer is controlled by a synchronization control circuit or unit 6.

In operation, the laser beam emitted in the form of pulses by the excimer laser 2 enters into the convex cylindrical lens 3 and is diverged thereby from its focal point position F. The diverged laser beam is convergingly reflected by the spherical mirror 4 so that it is incident on the mask M surface in an arcuate slit shape in the plane containing the x and y axes.

In general, commercially available excimer lasers are adapted to define an illumination area of rectangular or oblong shape, which has an intensity distribution in the form of a substantially regular trapezoid (a trapezoid having inclined side edges of the same length) in the longitudinal direction of the illumination area, and in the form of a substantially isosceles triangle (i.e. the Gaussian distribution) in the direction orthogonal to the longitudinal direction. Thus, the central portion of the illumination area has a light intensity higher than that of the marginal portion.

Figure 2C:
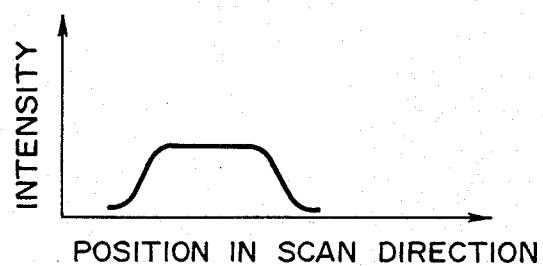
FIG. 2C is a graph showing the intensity distribution, in the scan direction, of one slit-scanning pulse employed in the FIG. 2A embodiment.

In the present embodiment, the pulsed laser beam is incident on the mask M surface in the manner that the longitudinal direction of the oblong-shaped illumination area corresponds to the slit-width direction on the mask M surface, i.e. the direction of x-axis. This ensures an intensity distribution in the form of a substantially regular trapezoid in the scan direction, i.e. in the direction of x-axis, such as shown in FIG. 2C.

Conventionally, when a light beam emitted from a light source is to be used, decreased level portions of the intensity distribution are cut off by means of an aperture or the like. According to the present invention, however, it is possible to use the decreased-intensity portions at the side edges of the intensity distribution as they are. If, however, an intensity distribution in the form of an accurately regular trapezoid, an accurately isosceles triangle or an accurately rectangular shape is desired, an attenuating element such as an ND filter having a suitable light-attenuation distribution may be disposed at a suitable position, e.g. a position A in FIG. 2A, in the optical path of the illumination unit 1.

The unshown carriage carrying thereon the mask M and wafer W is moved in the direction of x-axis relative to the projection optical system 5 so that the entire circuit pattern of the mask M is transferred onto the wafer W surface. During this pattern projection, the energization of the excimer laser 2 and the driving movement of the carriage are controlled by the synchronization control unit 6 in the manner that the following relationship is satisfied:

$$V = L \cdot N$$

where V is the scan speed (m/sec.), L is the distance (m) between two positions in the scan direction corresponding to the intensity level portions which are approximately equal to a half of the maximum level of the intensity distribution of each pulse (i.e. the width of the approx. half level portions of the intensity distribution of each pulse, in the direction of the slit-width or x-axis), N is the number of pulses repeatedly emitted by the excimer laser per one second.

Figure 3A:
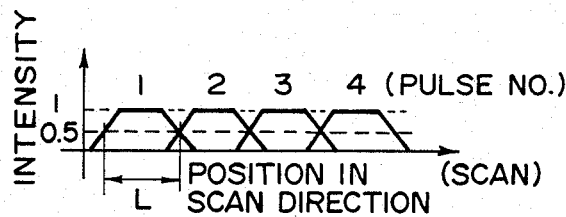
FIGS. 3A and 3B illustrate an example of the co-ordinated relationship between the scan and the pulse emission, according to the present invention.
Figure 3B:
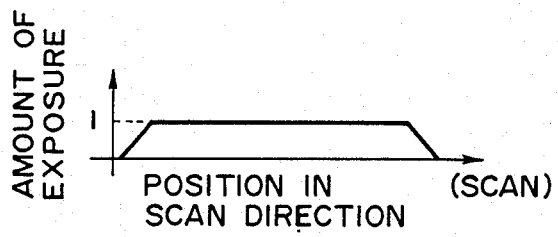

More specifically, the scanning movement of the carriage and the pulse oscillation of the excimer laser 2 are controlled such that the downstream one of two positions in the scan direction each corresponding to the intensity level portion which is approximately equal to the half of the maximum level of the intensity distribution of one pulse is coincident with the upstream one of two positions in the scan direction each corresponding to the intensity level portion which is approximately equal to the half of the maximum level of the intensity distribution of the succeeding pulse, with respect to the scan direction, such as shown in FIG. 3A. In this sense, L means the effective slit width in each pulse exposure. This substantially assures double exposure relative to the portions of the slit area corresponding to the decreased intensity-level portions of the intensity distribution of each pulse. As the result, uniform exposure is attained in the scan direction, such as shown in FIG. 3B. In this example of exposure control, the intensity distribution of each pulse is in the form of a regular trapezoid as shown in FIG. 3A, an isosceles triangle or other shapes similar to the formers.

Figure 4A:
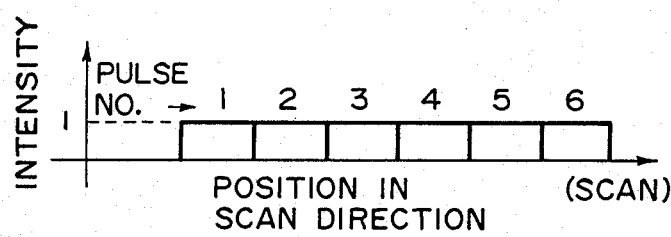
FIGS. 4A and 4B illustrate another example of the co-ordinated relationship between the scan and the pulse emission, according to the present invention.
Figure 4B:
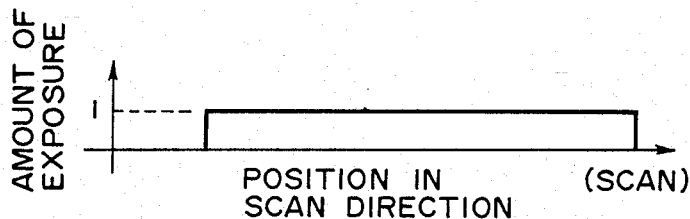

Another example of exposure control will now be described with reference to FIGS. 4A and 4B. In this example, the intensity distribution of the slit exposure pulse is in the form of a rectangle, as shown in FIG. 4A, and the actuation of the light source 2 and the driving movement of the carriage are controlled such that the time interval of the pulse emission is coincident with the time required for scanningly moving the carriage through a distance corresponding to the pulse width w in the scan direction, as the result of which, an unbroken series of pulses are established in the scan direction. In other words, the downstream one of two positions in the scan direction each corresponding to the zero-level portion of the intensity distribution of one pulse is coincident with the upstream one of the two positions in the scan direction each corresponding to the zero-level portion of the intensity distribution of the succeeding pulse, with respect to the scan direction, as shown in FIG. 4A. This assures uniform exposure in the scan direction, such as shown in FIG. 4B. It will be easily understood that, also in this example, the relationship $V = LN$ described with reference to FIGS. 3A and 3B. Further, the effective slit width which corresponds to the width of the intensity distribution of each pulse in this example can be denoted by L.

Description will now be made to any possible fluctuation in the time interval of pulse emission and/or in the scanning speed.

Figure 5A:
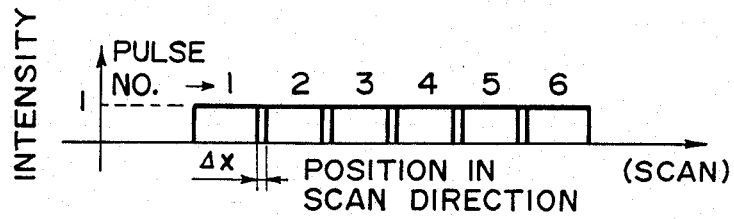
FIGS. 5A and 5B and FIGS. 6A and 6B illustrate the effectiveness of the present invention, in a case where the degree of co-ordination between the scan and the pulse emission is slightly degraded.
Figure 5B:
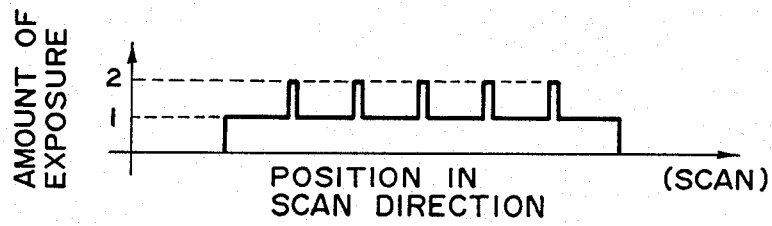

If, in the case of rectangular distribution of light intensity as shown in FIG. 5A, the scanning speed becomes lower and/or the time interval of the pulse emission becomes shorter, each of the pulses of the laser beam is incident on the mask M surface and thus on the wafer W surface at a position which is upstream of the correct exposure position (the position on which the pulse should be incident) through a distance $\Delta x$, with respect to the scan direction. As the result, the pulse exposures partially overlap with each other such as shown in FIG. 5A, so that the amount of exposure in each of the overlapped portions $\Delta x$ becomes twice as large as that in the non-overlapped portion.

Figure 6A:
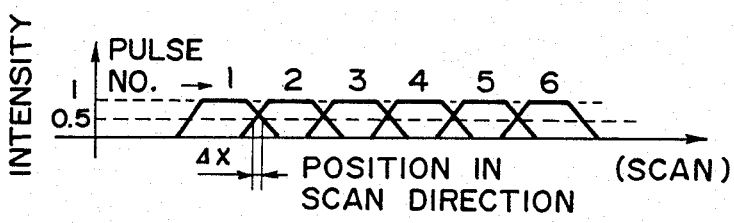
Figure 6B:
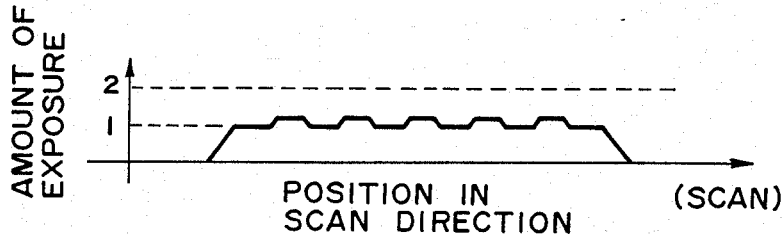

If, on the other hand, the pulse of the laser beam has an intensity distribution having decreasing portions at its side edges, such as the distribution in the form of a regular trapezoid, as shown in FIG. 6A, the positional deviation $\Delta x$ will usually cause a lower degree of uneven exposure, as compared with the intensity distribution in the form of a rectangle. In this respect, the example of exposure control described with reference to FIGS. 3A and 3B is advantageous as compared with the exposure control described with reference to FIGS. 4A and 4B.

While the present invention has been described with reference to the slit-scanning exposure apparatus of one-to-one magnification reflection type, the present invention is not limited to the exposure apparatus of reflection type and is applicable to the exposure apparatus of refraction type. Further, the scanning exposure is not limited to the slit-scan exposure, and a rectangular-area scanning may be employed. In such case, the projection optical system may comprise a Dyson optical system as an example.

Furthermore, the present invention is not limited to the one-to-one magnification exposure apparatus and is applicable to exposure apparatuses of reduced imaging magnification. In such case, the mask M and wafer W are moved in synchronism with each other but at different speeds corresponding to the ratio of the reduced magnification.

In the case of reduced magnification projection exposure, either the moving speed of the mask M or the moving speed of the wafer W may be regarded as the above-described scan speed V. Preferably, however, the moving speed of the mask M is regarded as the scan speed V, because, in the reduction exposure, the amount of displacement of the mask M per unit of time is larger than that of the wafer W per unit of time, so that accurate control of the synchronization is easier.

As described in the foregoing, the excimer laser usually defines an illumination area of rectangular shape having an intensity distribution in the form of a substantially regular trapezoid in the longitudinal direction and having an intensity distribution in the form of a substantially isosceles triangle in the direction orthogonal to the longitudinal direction. If, therefore, an intensity distribution of substantially isosceles triangle in the direction of x-axis is desired, the illumination unit 1 may be arranged such that the direction of the rectangular illumination area which is orthogonal to the longitudinal direction thereof corresponds to the slit-width direction (x-axis direction) on the mask M surface.

In accordance with the present invention, as has hitherto been described, the time interval of emission of pulses of the pulsed laser beam and the scanning speed for the exposure are synchronized or co-ordinated with each other, and this realizes a scanning exposure apparatus capable of achieving uniform exposure despite that fact that it employs a pulse-oscillation type light source in contrast to conventional continuous emission type light sources.

Further, according to the present invention, substantially uniform exposure is attainable even if a strictly synchronized or co-ordinated relation is not established between the scanning movement and the pulse emission. Therefore, the precision in the timing control can be tolerated.

Figure 7:
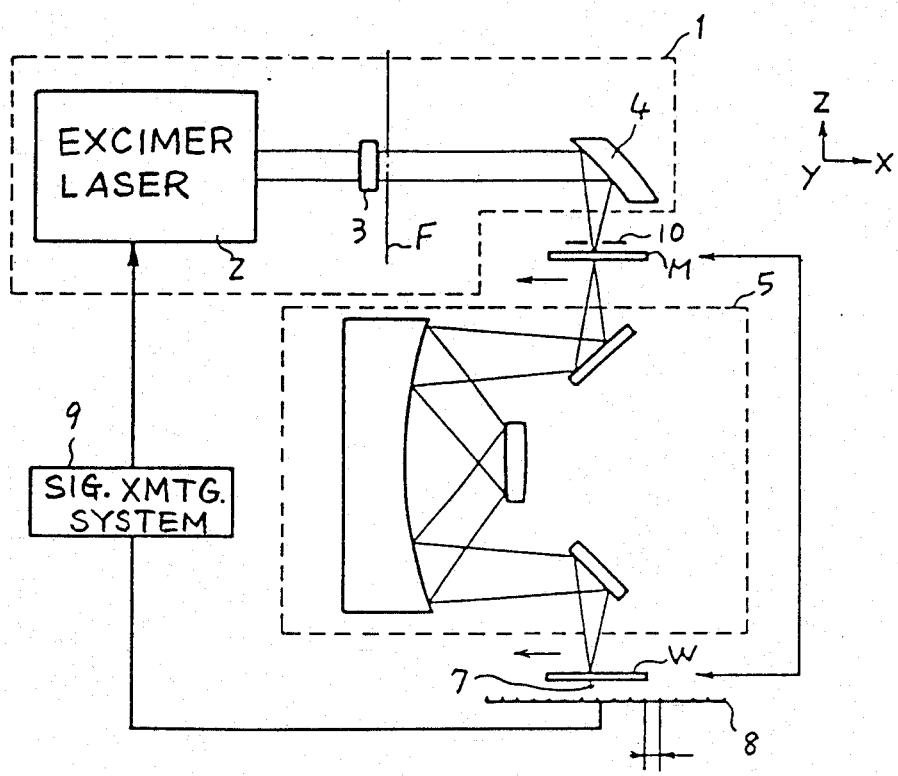
FIG. 7 is a sectional view schematically and diagrammatically showing a scanning exposure apparatus according to another embodiment of the present invention.

Referring now to FIG. 7, a scanning exposure apparatus according to another embodiment of the present invention will be described. Since this embodiment includes elements similiar to those of the FIG. 2A embodiment, detailed description to such elements will be omitted here, only for the sake of simplicity, by assigning the same reference numerals to the corresponding elements.

One of the distinctive features of the FIG. 7 embodiment lies in that the exposure apparatus is provided with a displacement detecting system including an index 7 and a scale 8, co-operative with each other. The index 7 is formed on an unshown movable carriage for carrying and moving the mask M and the wafer W as a unit. On the other hand, the scale 8 is formed on an unshown stationary table of the exposure apparatus and is opposed to the index 7. The scale 8 is formed with plural grades having the same intervals, and therefore, representing plural equidistantly spaced positions. The interval between adjacent ones of the grades is equal to the effective slit width L described with reference to FIG. 3A, for example.

The displacement detecting system is arranged to produce an electrical signal each time, during movement of the carriage, the index 7 moving with the carriage comes into alignment with one of the grades of the scale 8. In other words, each time the carriage displaces through a distance equal to the width L, an electrical signal is produced by the displacement detecting system.

The co-operative arrangement of the index 7 with the scale 8 can be realized by any one of magnetic means such as a magnetic scale, optical means such as a laser interferometer, photoelectric means such as an encoder, electrical means such as equidistantly disposed switch devices, etc. The highest accuracies will be attainable with the laser interferometer.

A signal transmitting system 9 is connected to the displacement detecting system to receive the electrical signals produced by the displacement detecting system. The signal transmitting system 9 is arranged to convert each of these electrical signals into a pulse suitable for triggering the Excimer laser 2 and applies such pulse to the Excimer laser 2 connected thereto. If the electrical signal produced by the displacement detecting system is usable, as it is, as the trigger pulse for the Excimer laser 2, then the signal transmitting system 9 is not necessary.

Denoted by numeral 10 is an arcuate-slit plate which is effective to positively define an exposure beam of arcuate shape in cross-section.

In operation, the laser beam emitted in the form of pulses by the Excimer laser 2 enters into the convex cylindrical lens 3 and is diverged thereby from its focal point position F. The diverged laser beam is convergingly reflected by the spherical mirror 4 so that it is incident on the mask M surface in an arcuate slit shape in the plane containing the x and y axes. The laser beam incident on the mask M passes therethrough and then is incident on the wafer W by way of the reflection type projection optical system 5.

On the other hand, the carriage carrying thereon the mask M and wafer W is moved in the direction of the x-axis relative to the projection optical system 5 so that the mask M and the wafer W are scanned with the pulses of the exposure laser beam. Such scanning movement of the carriage is continued until the entire circuit pattern of the mask M is transferred onto the wafer W surface.

More specifically, during scanning movement of the carriage relative to the projection optical system 5, the displacement detecting system produces an electrical signal each time the index 7 comes into alignment with one of the grades of scale 8. Each of the thus obtained electrical signals is converted by the signal transmitting system 9 into a trigger pulse which is applied to the Excimer laser 2. In response to reception of each trigger pulse, the Excimer laser 2 produces one pulse of exposure laser beam. Since the interval between adjacent ones of the equidistantly spaced grades of the scale 8 is equal to the effective slit width L (e.g. FIG. 3A), one exposure pulse is generated from the Excimer laser 2 each time the carriage displaces through such distance that is equal to the width L.

As a result, pulse exposures are provided at exactly equidistantly spaced positions. This accomplishes partially overlapping exposures such as shown in FIG. 3A (in a case of regular trapezoid distribution) or continuous exposures such as shown in FIG. 4A (in a case of rectangular distribution), whereby an uninterrupted and uniform exposure such as shown in FIG. 3B or 4B is attainable on the mask M surface.

Since the time period of one-pulse emission of the Excimer laser (i.e. the duration of each pulse) is extraordinarily short such as of an order of 10–20 nsec., continuous movement of the carriage would not cause substantial image blur.

The uniformity of the exposure beam in the scan direction can be improved by rectifying the intensity distribution by means of a compound-eye lens, a filter, an aperture plate or the like.

While, in this embodiment, the index 7 of the displacement detecting system is provided on a movable member and the scale 8 is provided on a stationary member, this may be reversed.

In this embodiment as described above, the displacement detecting system including the index 7 and the scale 8 is provided to detect the amount of displacement of the carriage relative to the projection optical system 5, more particularly to detect each unit displacement of the carriage relative to the projection optical system 5. If, however, relative displacement of the carriage per a unit time is detected, then the speed of such relative displacement, i.e. the scan speed V described with reference to the FIG. 2A embodiment, is detectable. Therefore, the cooperative arrangement of the index 7 with the scale 8 is operable also as a scan speed detecting system. In this sense, the co-operative arrangement of the index 7 and the scale 8 is applicable to the synchronization control unit 6 of the FIG. 2A embodiment.

As in the FIG. 2A embodiment, the FIG. 7 embodiment is not limited to one-to-one magnification projection exposure apparatus, but also is applicable to a reduced scale projection exposure apparatus. In such case, the mask M and wafer W are moved in synchronism with each other but at different speeds corresponding to the ratio of the reduced magnification, by separate carriages. In the case of reduced magnification exposure, either the displacement of the mask M relative to the projection optical system or displacement of the wafer W relative to the projection optical system may be monitored as the reference for controlling the triggering of the Excimer laser. Preferably, however, the displacement of the mask M is monitored because, in the reduction exposure, the displacement of the mask M per unit of time is larger than that of the wafer W per unit of time, so that accurate control of the triggering is easier.

In accordance with this embodiment of the percent invention as has been described in the foregoing, the triggering of the Excimer laser is based on a fixed and constant amount of displacement of the carriage relative to the projection optical system. The speed of relative movement of the carriage is not so material in the embodiment. Therefore, precise control for maintaining the relative movement of the carriage at an accurately constant speed is not necessary.

While the invention has been described with reference to the structures disclosed herein, it is not confined to the details set forth and this application is intended to cover such modifications or changes as may come within the purposes of the improvements or the scope of the following claims.

What is claimed is:

1. A method of scanning exposure, comprising:
   irradiating a relatively moving object with a pulsed laser beam comprising pulses each having an intensity distribution in the direction of relative movement of the object;
   wherein a relationship $V = L \cdot N$ is satisfied where V is the moving speed of the object, L is the distance between two positions in the direction of scan each corresponding to an intensity level portion which is approximately equal to a half of the maximum level of the intensity distribution of each pulse, and N is the number of pulses of the laser beam per a unit time.

2. A method according to claim 1, wherein the pulsed laser beam is provided by an excimer laser.

3. A scanning exposure apparatus, comprising:
   irradiation means for irradiating a pattern of a first object with a pulse-oscillated beam comprising pulses each having an intensity distribution in a predetermined direction;
   projection means for projecting, onto a second object, the pattern of the first object irradiated by the pulse oscillated beam; and
   means for moving each of the first and second objects relative to said projection means in a direction parallel to said predetermined direction, said moving means moving at least one of the first object and the second object at speed V;
   wherein a relationship $V = L \cdot N$ is satisfied where L is the distance between two positions in the direction of scan each corresponding to an intensity level portion which is approximately equal to a half of the maximum level of the intensity distribution of each pulse, and N is the number of pulses of the laser beam per a unit time.

4. An apparatus according to claim 3, wherein the intensity distribution of each pulse is in the form of a substantially regular trapezoid or in the form of a substantially isosceles triangle.

5. An apparatus according to claim 3, wherein the intensity distribution of each pulse is in the form of a rectangle.

6. An apparatus according to claim 3, wherein said irradiation means includes an excimer laser.

7. An apparatus according to claim 3, wherein an arcuate slit-like area on the first object is irradiated by a pulse as aforesaid and wherein said projection means includes a mirror optical system.

8. An apparatus according to claim 3, wherein said projection means comprises a one-to-one imaging system.

9. An apparatus according to claim 3, wherein said projection means comprises a reduced magnification imaging system.

10. A projection exposure apparatus for scanning a pattern of a first object with a beam to transfer the pattern onto a second object, comprising:
   irradiation means for producing a pulsed laser beam and irradiating the pattern of the first object with the pulsed laser beam;
   projection optical means for projecting, onto the second object, the pattern of the first object irradiated by the laser beam;
   means for moving the first and second objects relative to said projection optical means; and
   control means to actuate said irradiation means to cause it to produce a pulse of the laser beam each time a least one of the first and second objects displaces through a predetermined distance, wherein the pulse of the laser beam irradiating the pattern of the first object has an intensity distribution in a direction of relative movement of the first object and wherein said predetermined distance is equal to a distance between two positions in the direction of the relative movement each of which positions corresponds to an intensity level portion that is approximately equal to half of the maximum level of the intensity distribution of the pulse of the laser beam.

11. A method of scanning exposure for transferring a pattern of a mask onto a wafer, comprising:
   irradiating a mask moving relative to pulses of radiation, wherein the mask is irradiated with the pulses of radiation, wherein each said pulse has an intensity distribution in the direction of relative movement of the mask, such that the wafer is exposed to patterned radiation from the mask; and
   wherein a relationship $V = L \cdot N$ is satisfied, where V is the moving speed of the mask, L is the distance between two positions in the direction of scan, the intensity level of the pulsed radiation at each position being approximately equal to one half of the maximum level of the intensity distribution of each pulse, and N is the number of pulses of the laser beam per unit time.

12. A method according to claim 11, wherein said irradiating step further comprises the step of producing the pulsed radiation with an excimer laser.

* * * * *

UNITED STATES PATENT AND TRADEMARK OFFICE
CERTIFICATE OF CORRECTION

PATENT NO. : 4,822,975
DATED : April 18, 1989
INVENTOR(S) : MAKOTO TORIGOE

It is certified that error appears in the above-identified patent and that said Letters Patent is hereby corrected as shown below:

Title page:

IN [56] REFERENCES CITED

U.S. PATENT DOCUMENTS, "4,456,994" should read --4,458,994--.

IN [57] ABSTRACT

Line 8, "co-ordinate" should read --co-ordinated--.
Line 11, "V=LN" should read --V=L·N--.
Line 18, "repetition" should read --repetitions--.

COLUMN 1

Line 27, "wafer" should read --wafer.--.

COLUMN 3

Line 1, "is" should read --are--.

COLUMN 4

Line 45, "formers." should read --former--.

UNITED STATES PATENT AND TRADEMARK OFFICE
CERTIFICATE OF CORRECTION

PATENT NO. : 4,822,975

DATED : April 18, 1989

INVENTOR(S) : MAKOTO TORIGOE

Page 2 of 2

It is certified that error appears in the above-identified patent and that said Letters Patent is hereby corrected as shown below:

COLUMN 8

Line 17, "percent" should read --present--.
Line 22, "the" (second occurrence) should read --this--.

Signed and Sealed this

Twentieth Day of February, 1990

Attest:

JEFFREY M. SAMUELS

Attesting Officer    Acting Commissioner of Patents and Trademarks